(12) United States Patent
Han et al.

(10) Patent No.: US 8,735,931 B2
(45) Date of Patent: May 27, 2014

(54) LIGHT EMITTING DIODE PACKAGE AND FABRICATION METHOD THEREOF

(75) Inventors: Kyung Taeg Han, Gyunggi-Do (KR); In Tae Yeo, Seoul (KR); Hun Joo Hahm, Gyunggi-Do (KR); Chang Ho Song, Seoul (KR); Seong Yeon Han, Gwangju (KR); Yoon Sung Na, Gyunggi-Do (KR); Dae Yeon Kim, Gyunggi-Do (KR); Ho Sik Ahn, Incheon (KR); Young Sam Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/907,348

(22) Filed: Oct. 19, 2010

(65) Prior Publication Data

US 2011/0031526 A1 Feb. 10, 2011

Related U.S. Application Data

(62) Division of application No. 11/730,965, filed on Apr. 5, 2007.

(30) Foreign Application Priority Data

Apr. 17, 2006 (KR) .............................. 10-2006-34706

(51) Int. Cl.
    *H01L 33/62* (2010.01)
(52) U.S. Cl.
    USPC 257/99; 257/100; 257/E23.066; 257/E21.052; 438/26
(58) Field of Classification Search
    USPC ........ 257/99, 100, E23.066, E21.502; 438/26
    See application file for complete search history.

(56) References Cited

U.S. PATENT DOCUMENTS 6,486,543 B1 11/2002 Sano et al.
6,717,256 B1 4/2004 Suzuki et al.
(Continued)

FOREIGN PATENT DOCUMENTS

JP 11-087780 3/1999
JP 2000-261039 9/2000
(Continued)

OTHER PUBLICATIONS

Japanese Decision of Rejection, issued in Japanese Patent Application No. 2007-107666, w/ English translation thereof, dated Jun. 21, 2011.

(Continued)

*Primary Examiner* — Cathy N Lam
(74) *Attorney, Agent, or Firm* — McDermott Will & Emery LLP

(57) ABSTRACT

An LED package and a fabrication method therefor. The LED package includes first and second lead frames made of heat and electric conductors, each of the lead frames comprising a planar base and extensions extending in opposed directions and upward directions from the base. The package also includes a package body made of a resin and configured to surround the extensions of the first and second lead frames to fix the first and second lead frames while exposing underside surfaces of the first and second lead frames. The LED package further includes a light emitting diode chip disposed on an upper surface of the base of the first lead frame and electrically connected to the bases of the first and second lead frames, and a transparent encapsulant for encapsulating the light emitting diode chip.

10 Claims, 13 Drawing Sheets

(56) References Cited

U.S. PATENT DOCUMENTS

| | | | |
|---|---|---|---|
| 6,770,498 B2 | 8/2004 | Hsu | |
| 2003/0107316 A1 | 6/2003 | Murakami et al. | |
| 2004/0208210 A1 | 10/2004 | Inoguchi | |
| 2005/0145991 A1 | 7/2005 | Sakamoto et al. | |
| 2005/0236639 A1 | 10/2005 | Abe et al. | |
| 2005/0280017 A1 | 12/2005 | Oshio et al. | |
| 2006/0043401 A1* | 3/2006 | Lee et al. | 257/99 |
| 2006/0261366 A1* | 11/2006 | Yang | 257/100 |

FOREIGN PATENT DOCUMENTS

| | | |
|---|---|---|
| JP | 2001-185763 | 7/2001 |
| JP | 2003-174200 A | 6/2003 |
| JP | 2004-228387 | 8/2004 |
| JP | 2005-033028 | 2/2005 |
| JP | 2005-039030 | 2/2005 |
| JP | 2005-197369 A | 7/2005 |
| JP | 2005-311042 A | 11/2005 |
| JP | 2005-317661 A | 11/2005 |
| JP | 2005-353914 | 12/2005 |
| JP | 2006-222271 | 8/2006 |
| JP | 2007-165843 | 6/2007 |
| JP | 2007-194526 | 8/2007 |

OTHER PUBLICATIONS

United States Office Action, issued in U.S. Appl. No. 12/370,802, dated Jul. 8, 2011.
United States Office Action issued in U.S. Appl. No. 11/730,965 dated Jun. 8, 2011.
Japanese Office Action issued in Japanese Patent Application No. 2007-107666, dated Jan. 4, 2011.
Chinese Office Action, with English translation thereof, issued in Patent Application No. 200710096913.8 dated on Jul. 11, 2008.
Japanese Office Action, with English translation, issued in Japanese Patent Application No. 2007-107666, dated Jun. 29, 2010.
United States Office Action issued in U.S. Appl. No. 11/730,965 dated Dec. 22, 2010.
US Office Action issued in U.S. Appl. No. 12/370,802 dated Dec. 28, 2011.
United States Office Action issued in U.S. Appl. No. 11/730,965 mailed Nov. 16, 2012.
Japanese Office Action, and English translation thereof, issued in Japanese Patent Application No. 2010-217869 dated May 15, 2012.
United States Office Action issued in U.S. Appl. No. 11/730,965 dated Apr. 18, 2013.
United States Office Action issued in U.S. Appl. No. 11/730,965 dated Oct. 22, 2013.

* cited by examiner

LIGHT EMITTING DIODE PACKAGE AND FABRICATION METHOD THEREOF

CLAIM OF PRIORITY

This application is a Divisional of U.S. patent application Ser. No. 11/730,965, filed on Apr. 5, 2007, and claims the benefit of Korean Patent Application No. 2006-0034706 filed on Apr. 17, 2006, in the Korean Intellectual Property Office, the entire contents of each of which are hereby incorporated herein by reference.

BACKGROUND OF THE INVENTION

1. Field of the Invention

The present invention relates to a Light Emitting Diode (LED) and, more particularly, to an LED package having a simple configuration with superior heat radiation efficiency, and a fabrication method thereof.

2. Description of the Related Art

A light emitting diode (LED) is a semiconductor device for generating various colors of light in response to current application. The colors generated from the LED are determined by the chemical substances constituting the semiconductor of the LED. Such an LED has various merits such as a long lifetime, low power, excellent initial driving characteristics, high resistance for vibration and high tolerance for frequent power on/off compared to a light emitting device based on filament, and thus there has been a steadily increasing demand for the LEDs.

LEDs are recently adopted as backlights for lighting devices and large sized Liquid Crystal Displays (LCDs), which require large outputs, and accordingly the LEDs used therefor require especially excellent heat radiation capacities.

FIGS. 1 and 2 illustrate a conventional LED package mounted on a circuit board.

First, referring to FIG. 1, the LED package 1 has a heat slug 3 for seating the LED chip 2 thereon while functioning as a heat guiding means. The LED chip 2 receives electricity from an external source (not shown) through a pair of wires 7 and a pair of terminals 8. The upper part of the heat slug 3 including the LED chip 2 is encapsulated by an encapsulant 5 typically made of silicone, and a lens 6 is attached over the encapsulant 5. A housing 4 is formed around the heat slug 3 by general molding to support the heat slug 3 and the terminals 8.

Such an LED package 1 of FIG. 1 is mounted on a circuit board 10, which is a heat sink, to construct an LED assembly as shown in FIG. 2. At this time, a heat conducting pad 9 such as solder is interposed between the heat slug 3 of the LED package 1 and a metal heat radiating plate (not shown) of the circuit board 10, facilitating heat conductivity between them. In addition, the terminals 8 are also more stably connected to a circuit pattern (not shown) of the circuit board by the solder (not shown).

As described above, the LED package 1 shown in FIGS. 1 and 2 and the LED assembly with the LED package 1 mounted on the circuit board 10 are focused on effective discharge of the heat, i.e., heat radiation. That is, the LED package 1 has the heat sink, i.e., the heat slug 3 connected to the heat radiating plate of the circuit board 10 either directly or via the heat conducting pad 9 in order to absorb and discharge the heat generated from the LED chip 2. This allows the heat generated from the LED chip 2 to be mostly discharged via the heat slug 3 into the circuit board 10, and only a small amount of the heat to be discharged into the air through the surface of the LED package 1, i.e., through the housing 4 or the lens 6.

However, this conventional heat radiation structure is complicated and requires many components. Therefore, it is difficult to automate the manufacturing process of the LED package with assembly of many components, thus increasing the manufacturing time and costs.

FIG. 3 is a sectional view illustrating another conventional LED package.

The LED package shown in FIG. 3 is suggested in "SEMICONDUCTOR LIGHT-EMITTING DEVICE," U.S. Patent Application Publication No. 2005/0057144 (published on May 17, 2005). In this LED device or LED package, a cup-shaped reflecting frame 2 is installed on a surface of the substrate 1 with circuit patterns 3 and 6 formed thereon, and an LED chip 4 is mounted in the cup-shaped portion and electrically connected to the circuit pattern 3. In the meantime, the reference numeral 7 represents phosphor, the reference numeral 8 represents diffuser and the reference numeral 9 represents resin.

The LED package with the above described configuration requires a fewer number of components than that of FIG. 1 and can be advantageously fabricated into a relatively simple configuration. However, the heat generated from the LED chip 4 is transferred to a circuit board 10 (not shown in FIG. 3, see FIG. 2) via a heat radiation path H, thus resulting in low heat radiation efficiency.

SUMMARY OF THE INVENTION

The present invention has been made to solve the foregoing problems of the prior art and therefore an aspect of the present invention is to provide an LED package which can achieve superior heat radiation efficiency with a simple configuration.

Another aspect of the invention is to provide a method of fabricating an LED package which can achieve superior heat radiation efficiency.

According to an aspect of the invention, the invention provides a light emitting diode package which includes: first and second lead frames made of heat and electric conductors, each of the lead frames comprising a planar base and extensions extending in opposed directions and upward directions from the base, the second lead frame having a smaller width than the first frame and arranged apart from the first frame at a predetermined interval; a package body made of a resin and configured to surround the extensions of the first and second lead frames to fix the first and second lead frames while exposing underside surfaces of the first and second lead frames; a light emitting diode chip disposed on an upper surface of the base of the first lead frame and electrically connected to the bases of the first and second lead frames; and a transparent encapsulant for encapsulating the light emitting diode chip.

In the light emitting diode package according to the present invention, ends of the extensions are positioned at side portions of the package body.

In the light emitting diode package according to the present invention, at least one of the extensions of the first lead frame extends out of the package body to form a terminal.

In the light emitting diode package according to the present invention, the package body has a recess formed around the light emitting diode chip and a protrusion is formed in a predetermined width on an upper end of the recess. In this case, it is preferable that a portion of the transparent encapsulant fills the recess and another portion of the transparent encapsulant protrudes over the protrusion in a predetermined curvature.

In the light emitting diode package according to the present invention, the underside surfaces of the bases of the first and second lead frames are coplanar with an underside surface of the package body.

In the light emitting diode package according to the present invention, the first and second lead frames are arranged in parallel with each other.

According to another aspect of the invention, the invention provides a method of fabricating a light emitting diode package. The method includes:

machining a plate made of a heat and electric conductor of a predetermined thickness into a frame structure, the frame structure comprising first and second lead frame parts each having a planar base and extensions extending in opposed directions from the base, the second lead frame part formed in a smaller width than the first lead frame part and arranged apart at a predetermined interval from the first lead frame part;

bending the extensions of the first and second lead frame parts in such a way that the bases are positioned lower than the extensions so that the extensions extend in upward directions from the bases;

injection-molding a resin to form a package body, the package body surrounding the extensions of the first and second lead frame parts adjacent to the bases and thereby fixing the first and second lead frame parts in such a way that at least a part of upper surfaces and bottom surfaces of the bases of the first and second lead frame parts are exposed from the package body and distal ends of the extensions of the first and second lead frame parts extend out of side portions of the package body;

disposing a light emitting diode chip on the exposed upper surface of the base of the first lead frame part and electrically connecting the light emitting diode chip with the first and second lead frame parts;

encapsulating the light emitting diode chip with a transparent encapsulant; and cutting the extensions of the frame structure to obtain a light emitting diode package.

In the method according to the present invention, the step of forming a package body includes forming a recess around the light emitting diode chip and a protrusion in a predetermined width on an upper end of the recess. In this case, it is preferable that the step of encapsulating includes dispensing the transparent encapsulant in such a way that a portion of the transparent encapsulant fills the recess and another portion of the transparent encapsulant protrudes over the protrusion in a predetermined curvature.

In the method according to the present invention, the step of forming a package body includes forming the package body in such a way that the underside surfaces of the bases of the first and second frame parts are coplanar with an underside surface of the package body.

In the method according to the present invention, the step of forming a frame structure comprises forming the first and second lead frame parts in parallel with each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
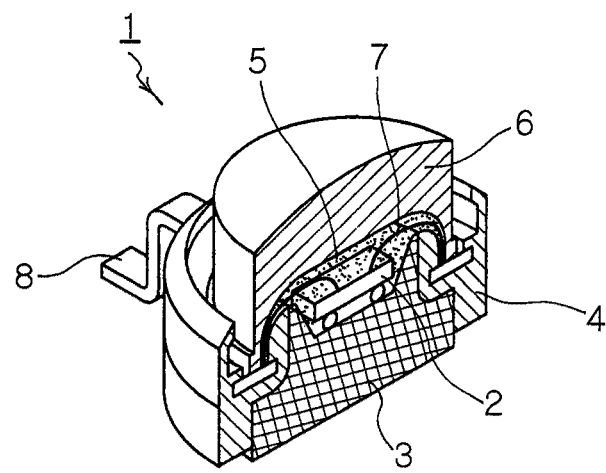
FIG. 1 is a sectional perspective view illustrating a conventional LED package.

Exemplary embodiments of the present invention will now be described in detail with reference to the accompanying drawings.

An LED package according to a first embodiment of the present invention is illustrated in FIGS. 4 to 8.

The LED package 100 according to this embodiment includes a pair of metal lead frames 110 and 120 and an insular package body 130 surrounding the lead frames 110 and 120.

The first lead frame 110 includes a planar base 112 and a pair of extensions 114 extending from opposed ends of the base 112. It is preferable that the base 112 is provided in an area as large as possible so that it has a large contact area as possible with a circuit board (see FIG. 10) described later, which is a heat sink. The extensions 114 are formed in a smaller width than the base 112, and are surrounded by the package body 130 to secure the lead frame 110 to the package body 130. Of course, the extensions 114 can be formed in the same width as the base 112, which is preferable when the package body 130 described later has a satisfactory level of strength.

The second lead frame 120 is formed in parallel with and at a predetermined interval from the first lead frame 110, and includes a base 122 and a pair of extensions 124. The base 122 and the extensions 124 are formed in the same width, but the present invention is not limited thereto.

Here, the extensions 114 and 124 are illustrated in the drawing as extending out of the package body 130, but the present invention is not limited thereto. The end surfaces of the extensions 114 and 124 can be coplanar with the side surface of the package body 130.

Figure 16:
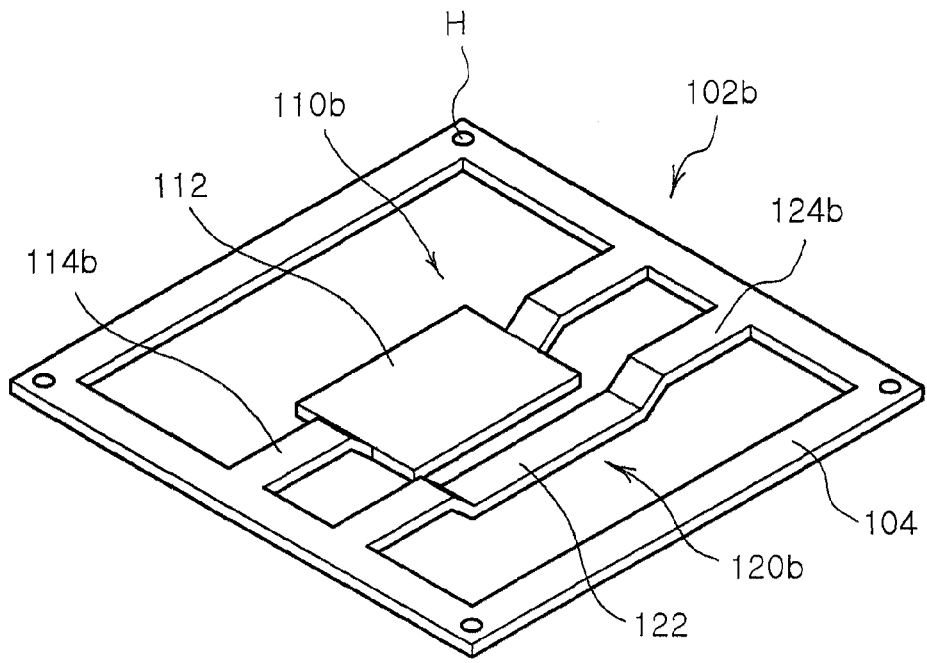

The configurations of the first and second lead frames 110 and 120 can be more clearly understood with reference to FIG. 16. That is, the first and second lead frames 110 and 120 are obtained by cutting the extensions 114b and 124b of a frame structure 102b in FIG. 16 in a suitable length.

The package body 130 is injection-molded around the lead frame 110 and 120 to surround the lead frames 110 and 120. At this time, the package body 130 has a recess or a cup-shaped part 132 formed therein to expose central portions of the bases 112 and 122 of the lead frames 110 and 120. This cup part 132 is the space for mounting the LED chip 140. An annular protrusion 134 is formed on an upper part of the cup part 132, and has a predetermined width W.

Figure 6:
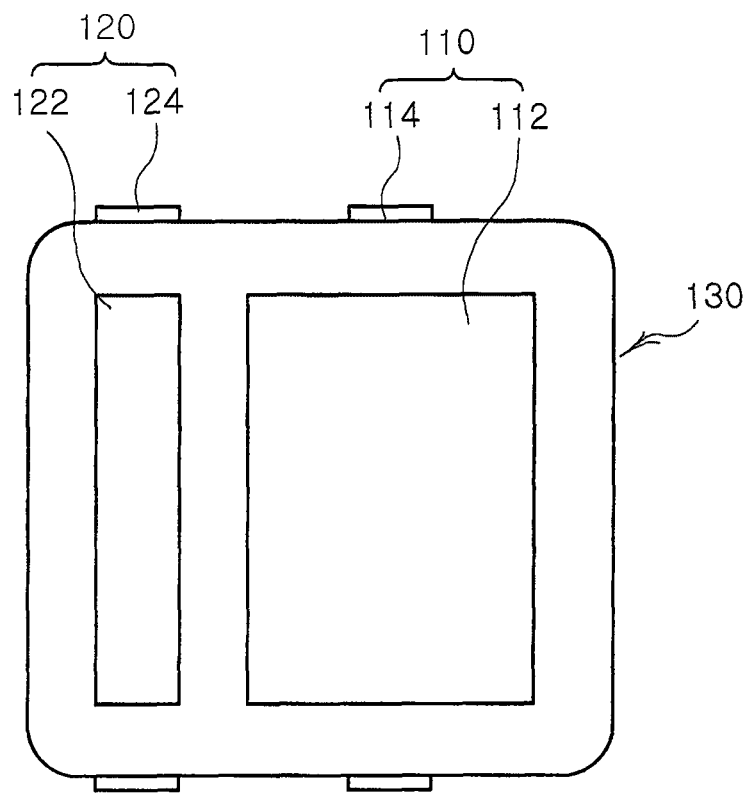
FIG. 6 is a bottom view of the LED package of FIG. 4.

The package body 130 is formed in such a way that the underside surfaces of the bases 112 and 122 of the first and second lead frames 110 and 120 are exposed. That is, as shown in FIG. 6, the underside surfaces of the bases 112 and 122 are exposed through an underside surface of the package body 130.

The LED chip 140 is seated on an upper surface of the base 112 of the first lead frame 110 and electrically connected to the base 122 of the second lead frame 120 by a wire 142.

The illustrated LED chip 140 is a so-called vertical structure LED chip. With this LED chip, the positive and negative electrodes are formed on upper and lower surfaces, respectively. As illustrated, in a case where the upper surface is the positive electrode connected to the base by the wire 142, the LED chip is electrically connected by the negative electrode in the lower surface thereof to the base 112 of the first lead frame 110. Alternatively, in the case of a horizontal structure LED chip with both electrodes formed on the same surface thereof, the LED chip can be electrically connected to the base 112 of the first lead frame 110 using another wire (not illustrated).

As the LED chip 140 is seated on the base 112 to be electrically connected to the bases 112 and 122, the base 112 serves a function of transferring the heat generated from the LED chip 140 to the circuit board 160 (see FIGS. 10 and 11) described later and a function of an electric connector for supplying electricity to the LED chip 140.

Figure 9:
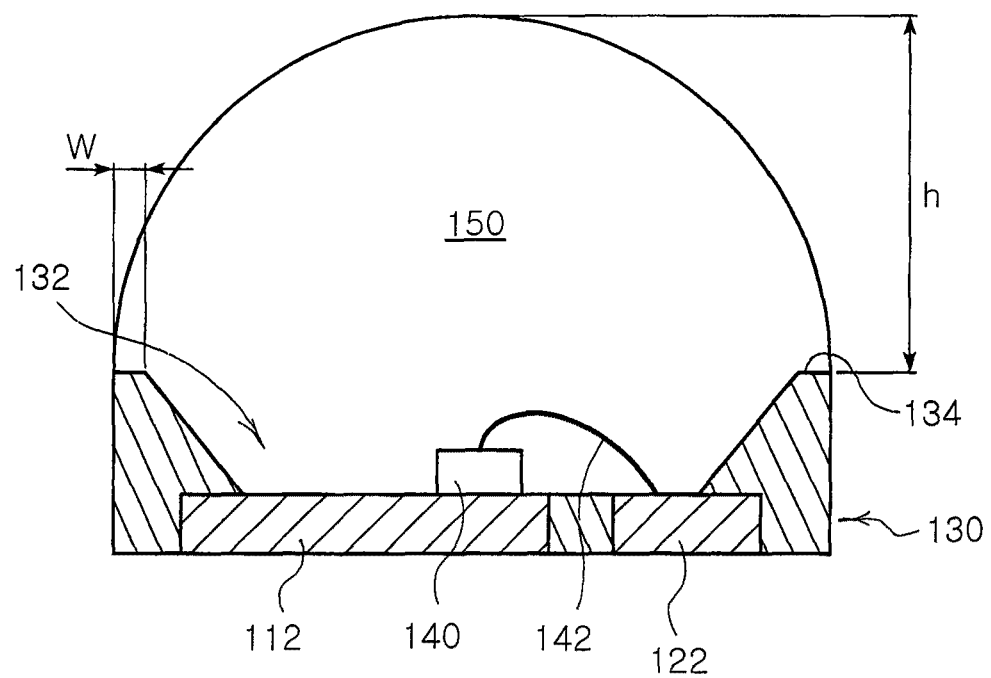
FIG. 9 is a sectional view corresponding to FIG. 7 illustrating the LED package with an encapsulant also functioning as a lens.

The LED package 100 according to the present invention further includes a transparent encapsulant 150 shown in FIG. 9. The encapsulant 150 is obtained by pouring a resin into the cup part 132 to form a convex shape and curing the resin. That is, the encapsulant 150 not only encapsulates the LED chip 140 and the wires 142 but also functions as a lens that guides the light emitted from the LED chip 140 to the outside in a desired beam angle.

At this time, the height h of the portion of the encapsulant 150 that functions as the lens is determined according to the width W of the protrusion 134 and the viscosity and amount of the resin making up the encapsulant 150. For example, the width W of the protrusion 134 and the viscosity and amount of the encapsulant 150 can be adjusted to form the encapsulant 150 in a predetermined curvature with a desired height h.

The resin of the encapsulant 150 is preferably a transparent elastomer of gel type, for example, silicone. The silicone is less susceptible to changes incurred by the light of a short wavelength, such as yellowing, and has a high refractive index, thus possessing superior optical properties. In addition, unlike epoxy, it maintains a gel or elastomer state even after it is cured, thus protecting the LED chip 140 more stably from the stress by the heat, vibrations and external impacts. For the transparent encapsulant 150, phosphor and/or diffuser may be dispersed in the elastomer.

Figure 10:
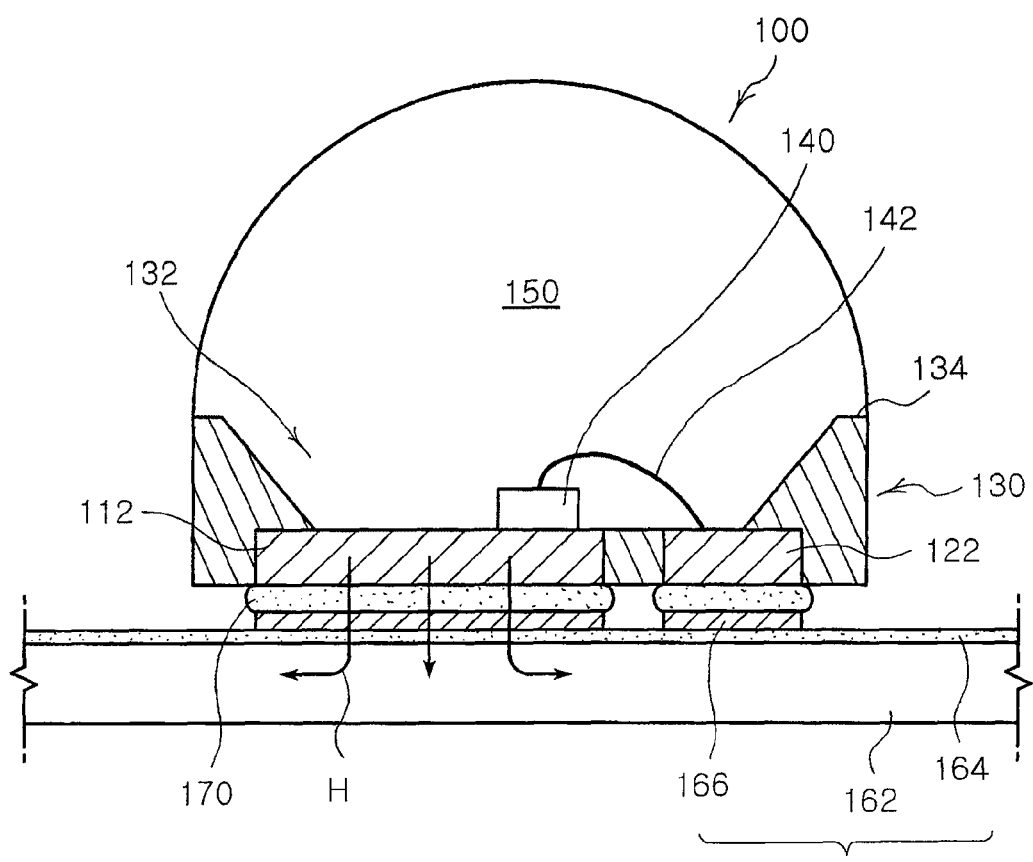
FIGS. 10 and 11 are sectional views illustrating the LED package of FIG. 9 mounted on a circuit board.
Figure 11:
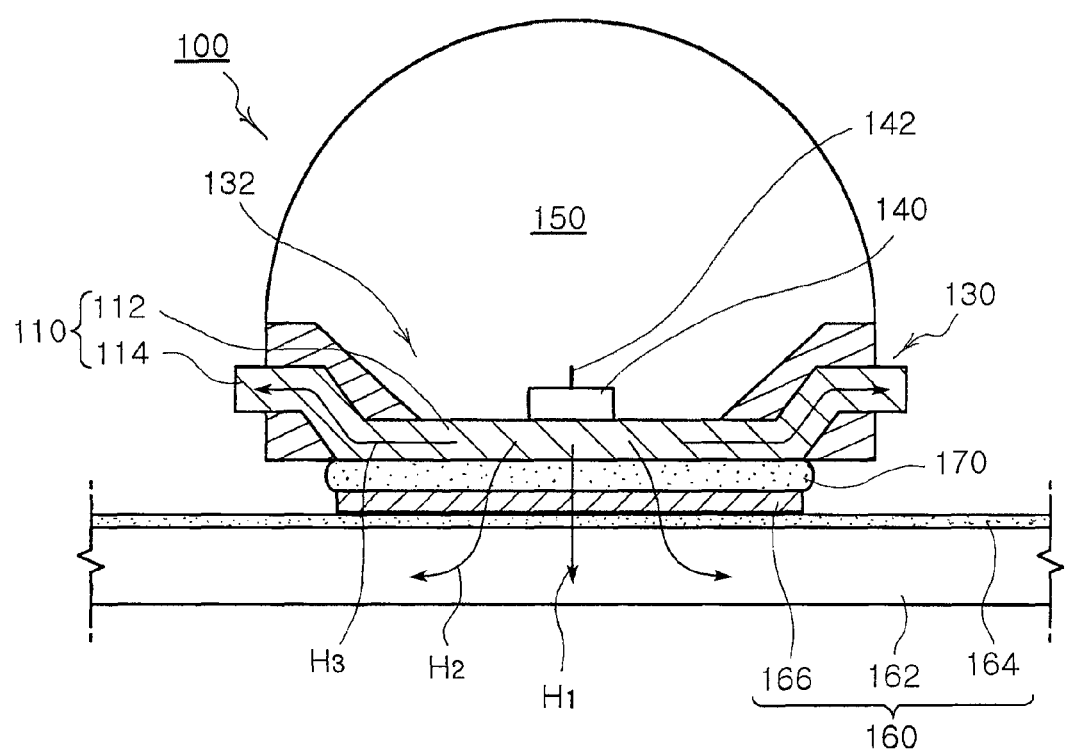

Now, the heat radiation operation of the LED package 100 will be examined with reference to FIGS. 10 and 11.

The LED package 100 is mounted on a circuit board 160 shown in FIGS. 10 and 11. The illustrated circuit board 160 is composed of a metal substrate 162, an insulation film 164 formed on a surface of the metal substrate 162 and conductive patterns 166 formed on surfaces of the insulation film 164. When the LED package 100 according to the present invention is mounted on such a circuit board 160, the LED package 100 is positioned such that the bases 112 and 122 of the first and second lead frames 110 and 120 come in contact with the conductive patterns 166, and are then solder-bonded. This allows the solder 170 to integrate the bases 112 and 122 of the first and second lead frames 110 and 120 with the conductive patterns 166, thereby mounting the surface-mounted LED package 100 onto the circuit board 160. Here, the bases 112 and 122 of the lead frames 110 and 120 are connected to an external power source (not shown) via the conductive patterns 166, thereby providing power to the LED chip 140.

Then, when a voltage is applied, the LED chip 140 generates light together with heat. Referring to FIG. 10, the heat H generated is discharged into the metal substrate 162 through the lead frame base 112 underneath the LED chip 140. Such a heat radiation path is shorter in length compared to those in the prior art shown in FIGS. 2 and 3, thus increasing the heat radiation efficiency.

In the meantime, referring to FIG. 11, the heat generated from the LED chip 140 is diffused and radiated through the lead frame base 112. That is, a portion of the heat H1 is transferred directly downward to the circuit board 160 while another portion of the heat H2 spreads along the base 112 and is transferred to the circuit board 160. In the meantime, other portion of the heat H3 spreads along the base 112 and is transferred to the extension 114. As the base 112 is formed in a relatively large area, the heat generated from the LED chip 140 is transferred to the circuit board 160 via a large area. In addition, it can be appreciated that the extensions 114 also contribute to the enhancement of the spreading efficiency of the heat.

Figure 12:
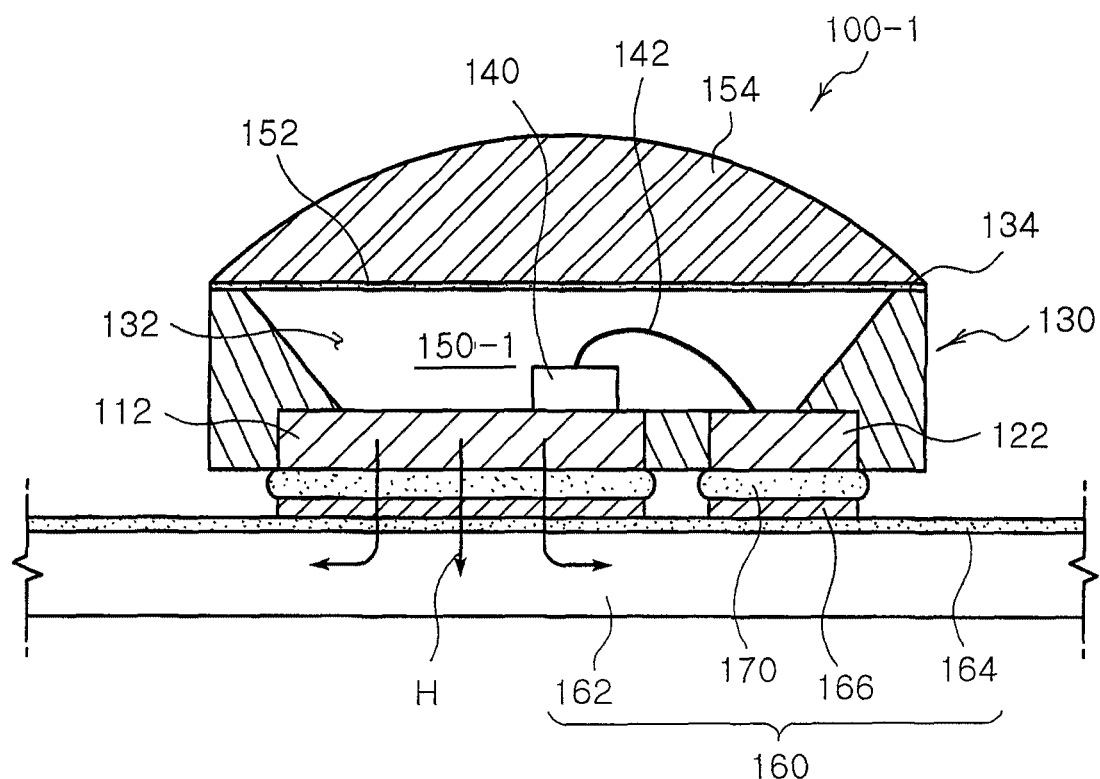
FIG. 12 is a sectional view corresponding to FIG. 7 illustrating the LED package with an encapsulant and a lens.

The LED package 100-1 shown in FIG. 12 has the same configuration as FIGS. 10 and 11 except for the feature that the encapsulant 150 in FIGS. 10 and 11 is substituted by an encapsulant 150-1 and a lens 154. The lens 154 can be made of various transparent materials, guiding the light emitted from the LED chip 140 to the outside in a desired beam angle. In FIG. 12, the lens 154 is fabricated separately and then attached to the encapsulant 150-1 and the protrusion 134 by an adhesive layer 152. Alternatively, the lens can be formed on upper surfaces of the encapsulant 150-1 and the protrusion 134 by transfer molding, etc.

Figure 7:
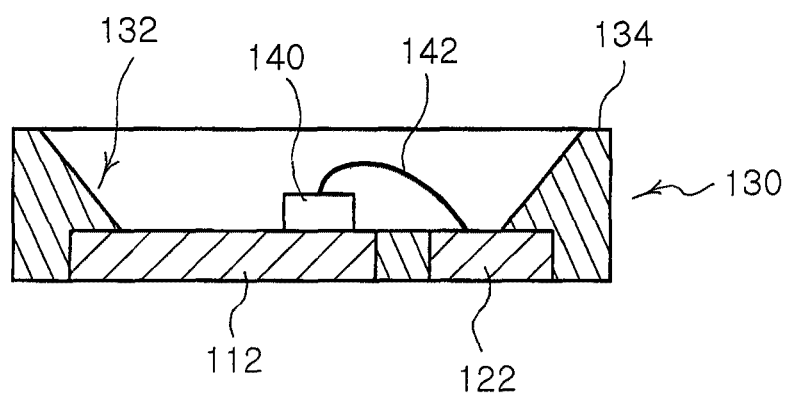
FIG. 7 is a sectional view cut along the line A-A of FIG. 5.
Figure 13:
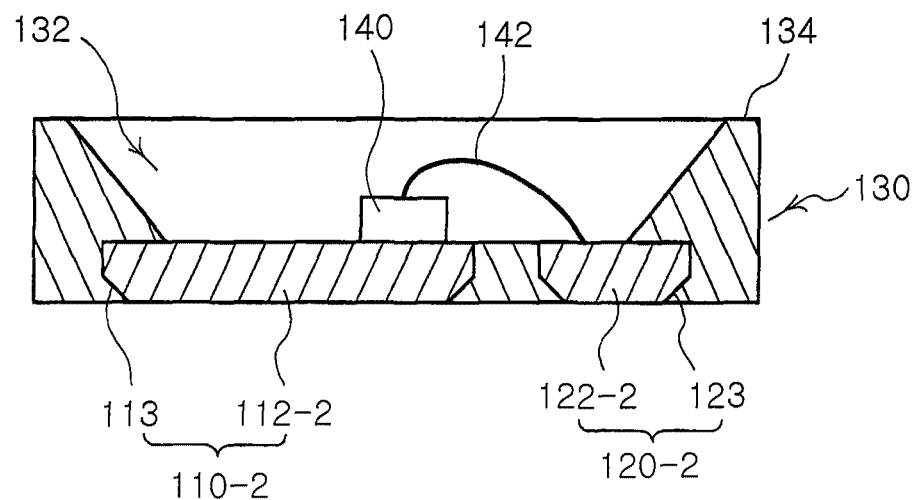
FIG. 13 is a sectional view illustrating an LED package according to a second embodiment of the present invention.

FIG. 13 illustrates an LED package according to another embodiment of the present invention in a sectional view corresponding to FIG. 7. The LED package 100-2 according to this embodiment has the same configuration as the afore-described LED package 100, 100-1, except for the feature that the opposed portions of the underside surfaces of the bases 112-2 and 122-2 of the first and second lead frames 110-2 and 120-2 are chamfered to form sloping surfaces 113 and 123.

Such sloping surfaces 113 and 123 lengthen and complicate the path through which external impurities and moisture may eventually reach the chip 140. In addition, the sloping surfaces 113 and 123 are surrounded by the resin of the package body 130, enhancing the bonding and sealing qualities between the lead frame bases 112-2 and 122-2 and the package body 130.

In the meantime, the sloping surfaces 113 and 123 can be formed in only one portion of the bases 112-2 and 122-2 of the first and second lead frames 110-2 and 120-2, for example, only in a portion adjacent to the LED chip 140.

Figure 14:
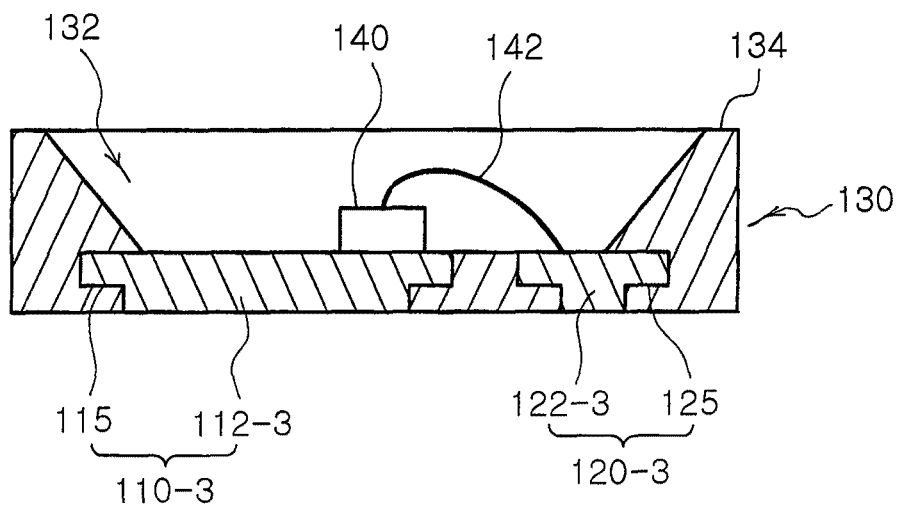
FIG. 14 is a sectional view illustrating an LED package according to a third embodiment of the present invention.

FIG. 14 illustrates an LED package according to further another embodiment of the present invention in a sectional view corresponding to FIG. 7. The LED package 100-3 according to this embodiment has the same configuration as the aforedescribed LED package 100, 100-1, 100-2, except for the feature that steps 115 and 125 are formed in opposed portions of the bases 112-3 and 122-3 of the first and second lead frames 110-3 and 120-3.

Like the sloping surfaces 113 and 123, these steps 115 and 125 lengthen and complicate the path through which the external impurities and moisture may eventually reach the chip 140. In addition, the steps 115 and 125 are surrounded by the resin of the package body 130, enhancing the bonding and sealing qualities between the lead frame bases 112-3 and 122-3 and the package body 130.

In the meantime, the steps 115 and 125 can be formed only in one portion of the bases 112-3 and 122-3 of the first and second lead frames 110-3 and 120-3, for example, only in a portion adjacent to the LED chip 140, depending on the needs.

Now, a method of fabricating an LED package 100 according to the present invention will be explained in a stepwise manner with reference to FIGS. 15 to 19.

Figure 15:
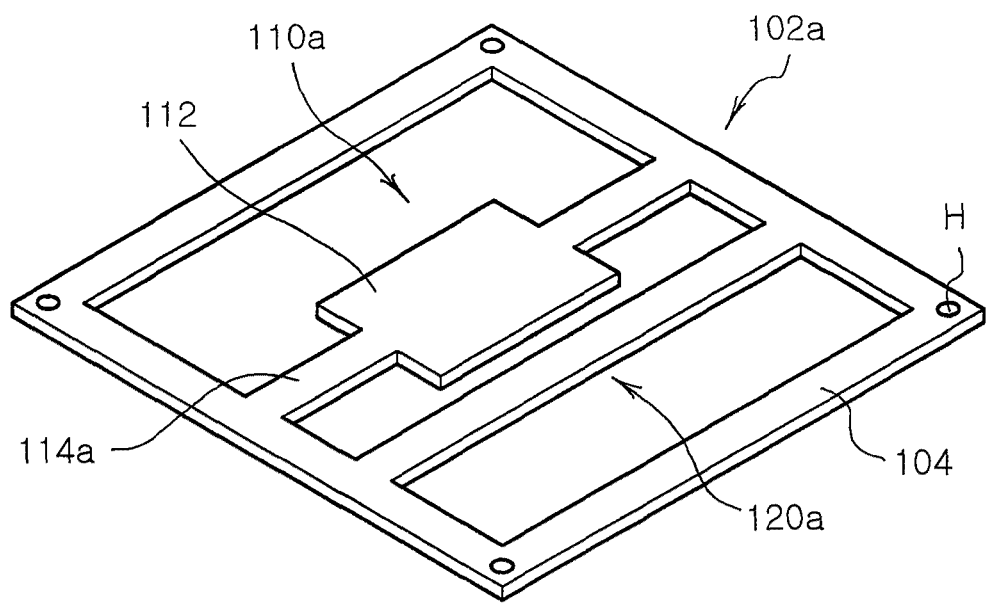
FIGS. 15 to 19 are sectional views illustrating a stepwise method of fabricating an LED package according to the present invention.

First, a metal plate or a sheet metal of a predetermined thickness is prepared and made into a preliminary frame structure 102a shown in FIG. 15 via punching or blanking. The preliminary frame structure 102a includes a peripheral portion 104 and a first lead frame part 110a and a second lead frame part 120a formed in the inner side of the peripheral portion 104. The first lead frame part 110a is to be the first lead frame 110 and the second lead frame part 120a is to be the second lead frame 120 described hereinabove after the frame structure 102a undergoes the following fabrication steps described later.

The first lead frame part 110a is composed of a base 112 of a relatively larger area and a pair of extensions 114a extended from opposed ends of the base 112 to the peripheral portion 104. The second lead frame part 120a is formed at a predetermined interval from the first lead frame part 110a, in the shape of a narrow strip and has opposed ends connected to the peripheral portion 104.

In addition, holes H are formed in the corners of the frame structure 102. The holes H are used to fix or guide the frame structure 102a.

The frame structure 102a shown in FIG. 15 is bent via pressing, etc. to obtain a frame structure 102b shown in FIG. 16.

Figure 8:
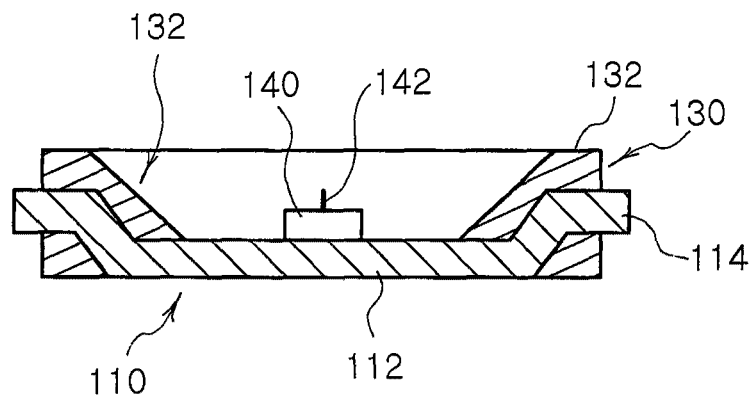
FIG. 8 is a sectional view cut along the line B-B of FIG. 5.

As a result, the extensions 114b of the first lead frame part 110b are bent in a shape that is identical to the one shown in FIG. 8. The only difference is that the extensions 114b in the step shown in FIG. 16 are still connected to the frame structure 102b whereas the extensions 114 shown in FIG. 8 are independently separated.

In addition, the second lead frame part 120b are bent in such a way that a base 122 is formed in the middle with the extensions 124b formed at opposed ends from the base 122.

Figure 17:
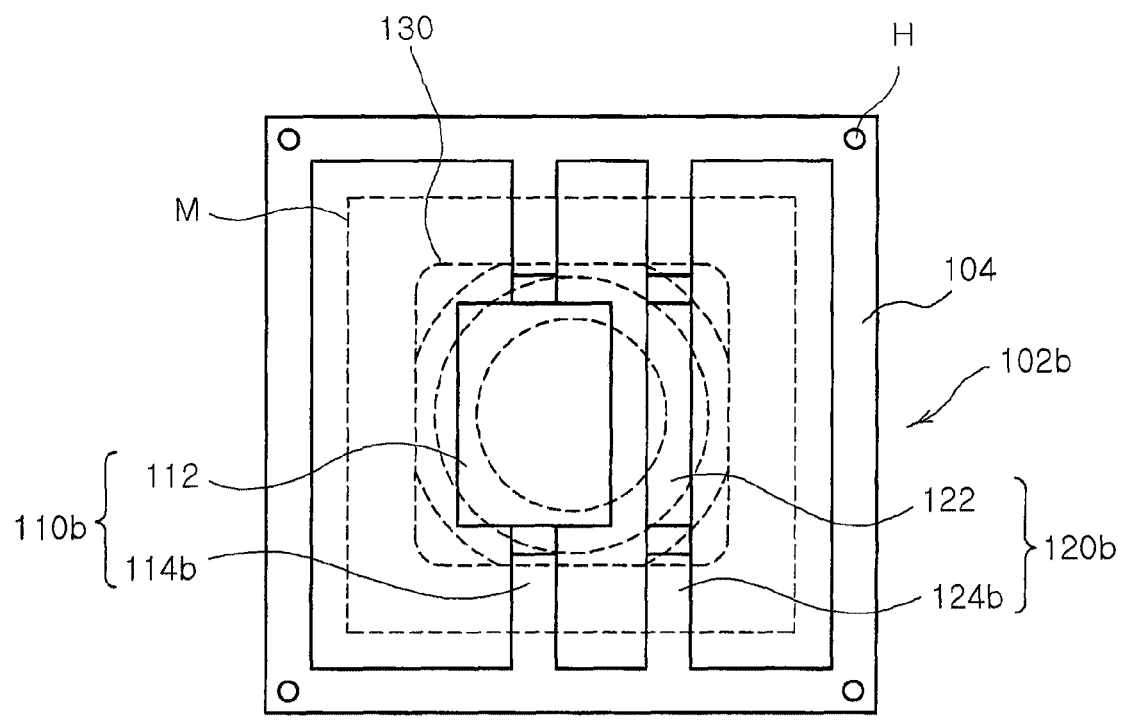
Figure 18:
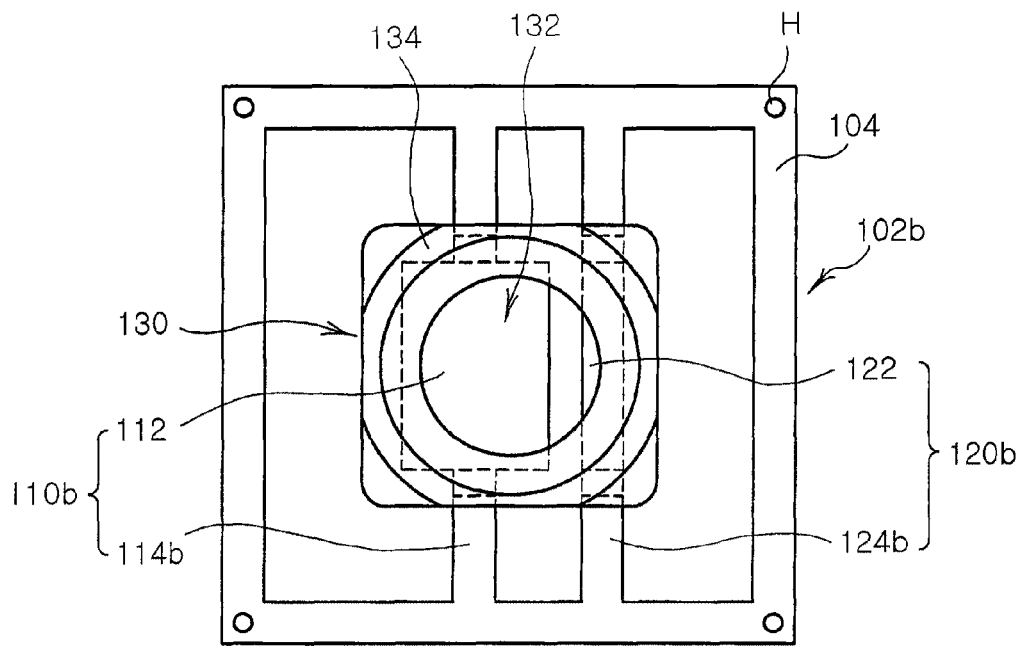
Figure 19:
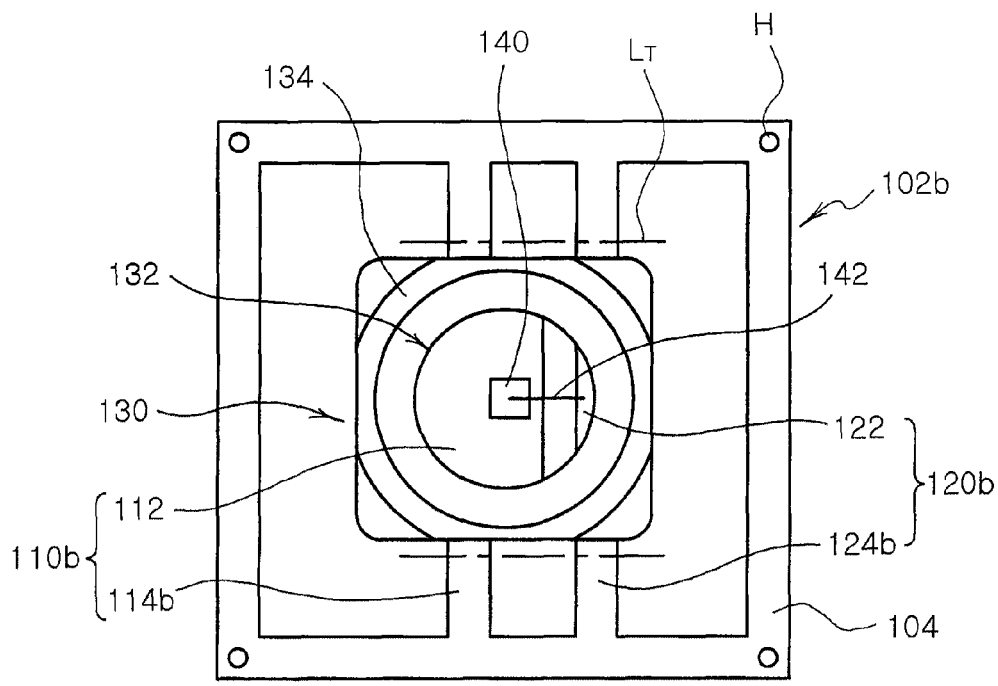

Then, as shown in FIG. 17, the frame structure 102b is disposed in a mold M and a resin is injected into the mold M to form a package body 130 as shown in FIG. 18. The shape of the package body 130 is identical to the one shown in FIGS. 4 to 8.

Thereafter, an LED chip 140 is disposed and electrically connected on the base 112 of the first lead frame part 110b inside a recess 132 of the package body 130 while electrically connected to the base 122 of the second lead frame part 120b by a wire 142. The LED chip 140 is illustrated as a vertical structure but it can be a horizontal structure. In this case, the LED chip is electrically connected to the base 112 of the first lead frame part 110b by the wire.

Then, a resin is poured into the recess 132 to form a convex shape and cured to obtain an encapsulant 150 shown in FIG. 9. Then, the extensions 114b and 124b are cut along the cutting line LT to complete an LED package 100. Of course, cutting can be done prior to forming the encapsulant 150.

The method explained with reference to FIGS. 15 to 19 is to obtain the LED package 100 shown in FIG. 9, which can be modified to obtain the LED package 100-1 shown in FIG. 12. That is, the resin can be poured in the recess 132 to form a planar surface to obtain a planar encapsulant 150-1 with a lens 154 bonded on the encapsulant 150-1, thereby completing the LED package 100-1 shown in FIG. 12.

In addition, the frame structure 102b can be modified to obtain the packages 100-2 and 100-3 shown in FIG. 13 or 14.

Figure 20:
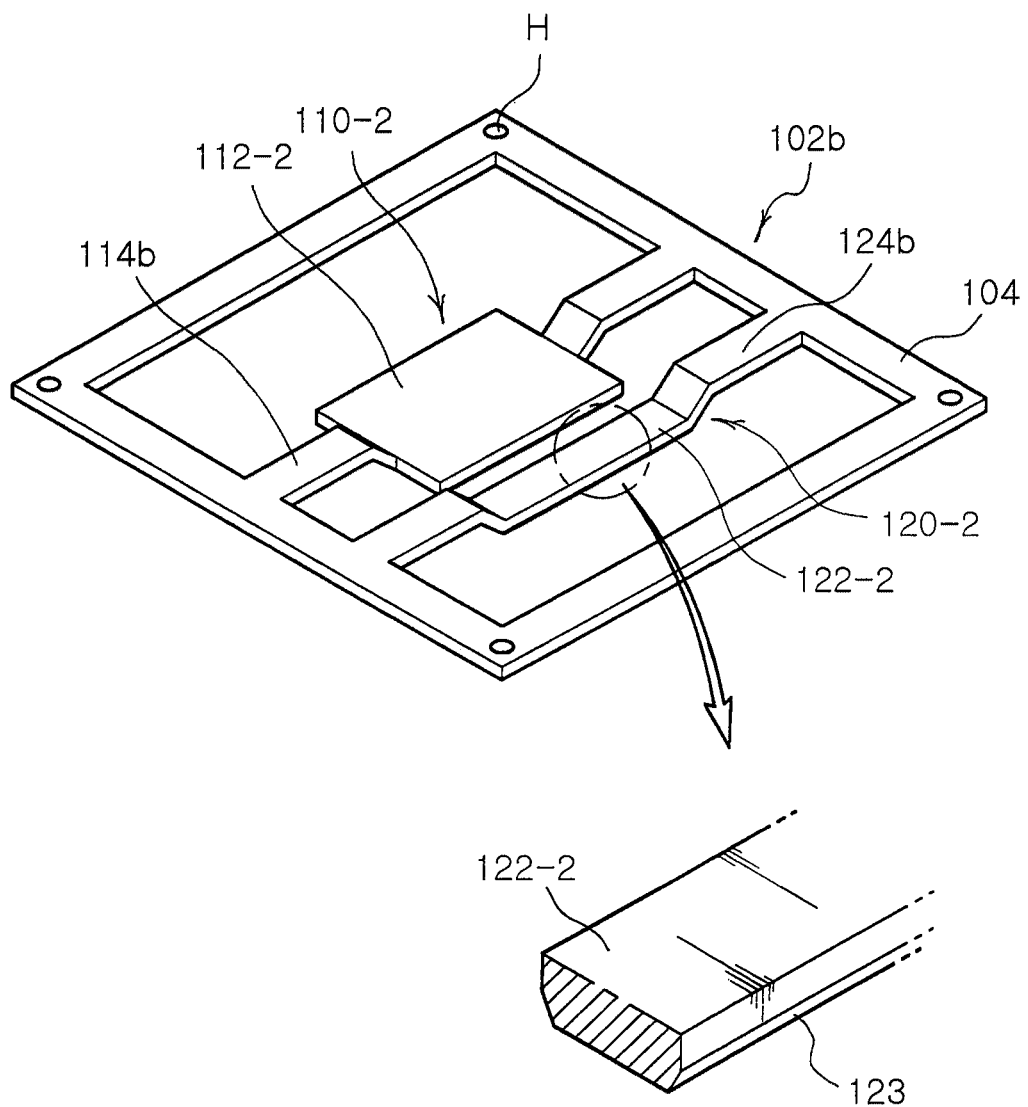
FIG. 20 is a perspective view illustrating a first step of a method of fabricating an LED package according to another embodiment of the present invention.

For example, as shown in FIG. 20, when preparing the frame structure 102b, the sloping surfaces 123 are formed in a length direction in opposed portions of the bottom surface of the base 122-2. The steps shown in FIGS. 17 to 19 can be implemented on this frame structure 102 to obtain the package 100-2 shown in FIG. 13. In FIG. 20, the opposed sloping surfaces in the underside surface of the base 122-2 are omitted in the drawing for convenience, but the shape of the sloping surfaces is identical to the one shown in FIG. 13.

In addition, instead of the sloping surfaces 123, the steps 115 and 125 can be formed as shown in FIG. 14, to obtain the package 100-3 shown in FIG. 14.

Figure 21:
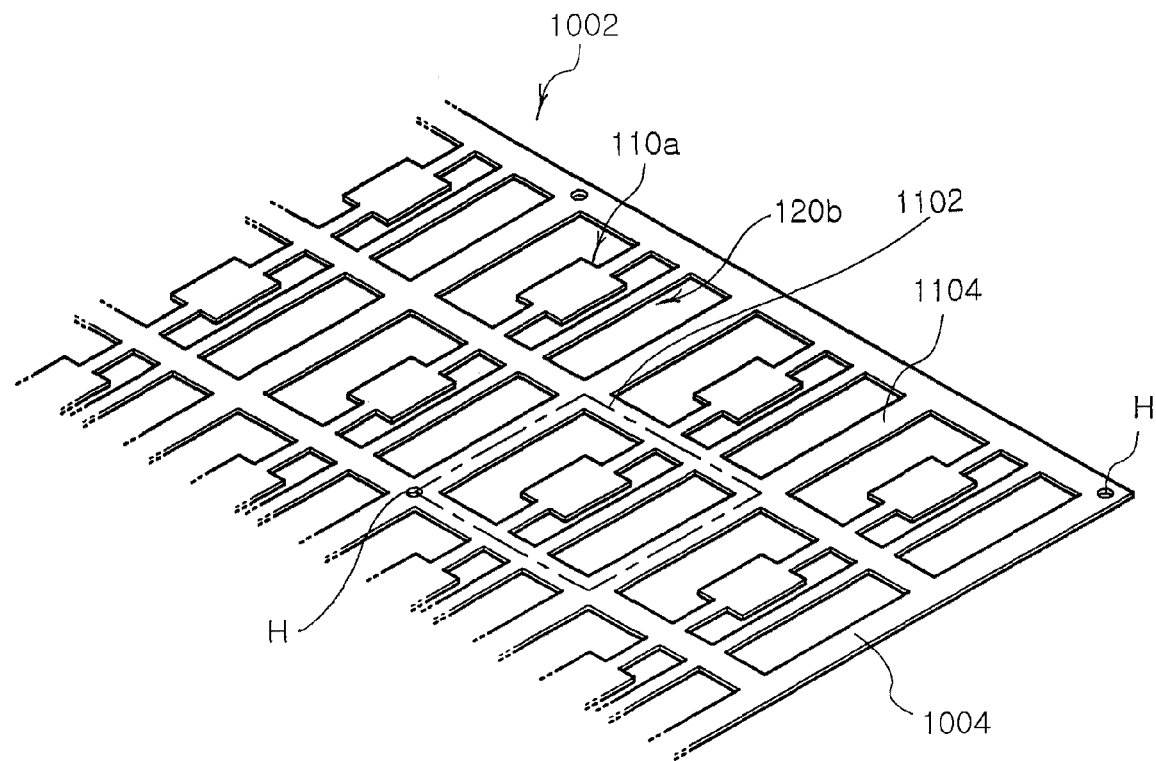
FIG. 21 is a perspective view illustrating a first step of a method of fabricating an LED package according to further another embodiment of the present invention.

A plurality of LED packages can be fabricated simultaneously using a frame array sheet 1002 shown in FIG. 21.

This frame array sheet 1002 is obtained by punching or blanking a metal plate or a sheet metal of a predetermined thickness. In the frame array sheet 1002, a plurality of frame structure regions 1102 are formed, which correspond to a plurality of the frame structure shown in FIG. 15. Therefore, the frame array sheet 1002 is composed of a plurality of frame structures 102a shown in FIG. 15.

The frame structure regions 1102 are defined, respectively, by the peripheral portions 1004 and middle portions 1104 of the frame array sheet 1002, and the middle portions 1104 can be omitted in the frame array sheet 1002 if necessary. In addition, holes H are formed in the peripheral portions 1004 and the middle portions 1104 to fix or guide the frame array sheet 1002.

Using the frame array sheet 1002 allows manufacturing a plurality of LED packages 100 simultaneously.

Figure 22:
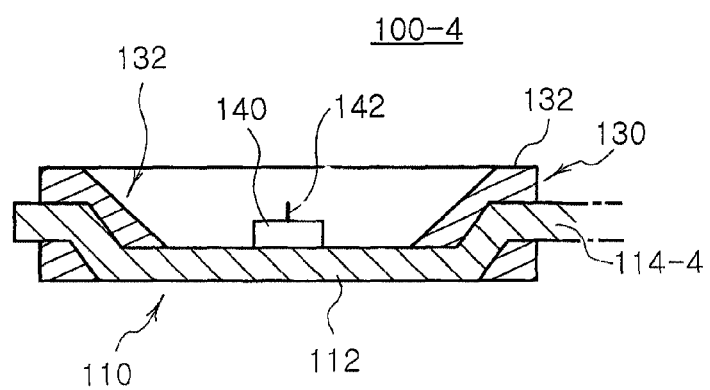
FIG. 22 is a sectional view illustrating an LED package according to a fourth embodiment of the present invention.

An LED package 100-4 according to further another embodiment of the present invention will now be explained with reference to FIG. 22.

Figure 2:
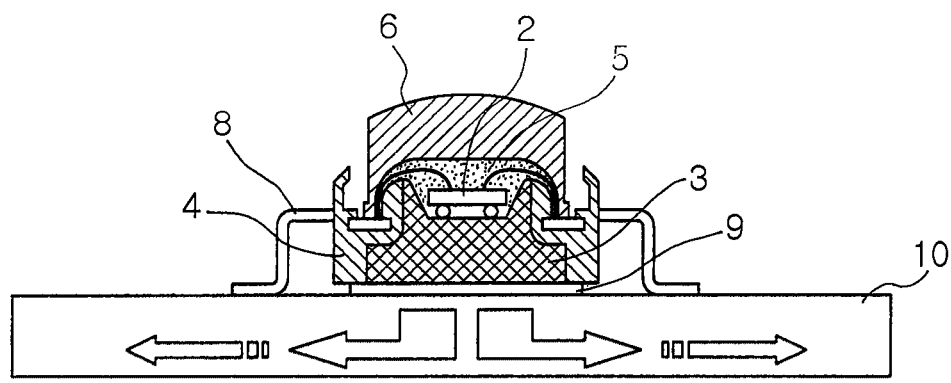
FIG. 2 is a sectional view illustrating the LED package of FIG. 1 mounted on a circuit board.
Figure 3:
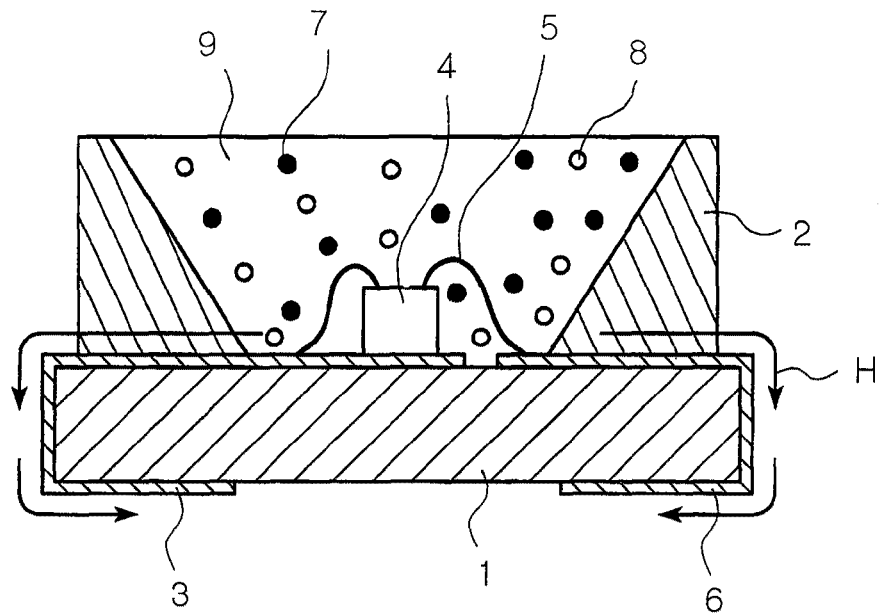
FIG. 3 is a sectional view illustrating another conventional LED package.
Figure 4:
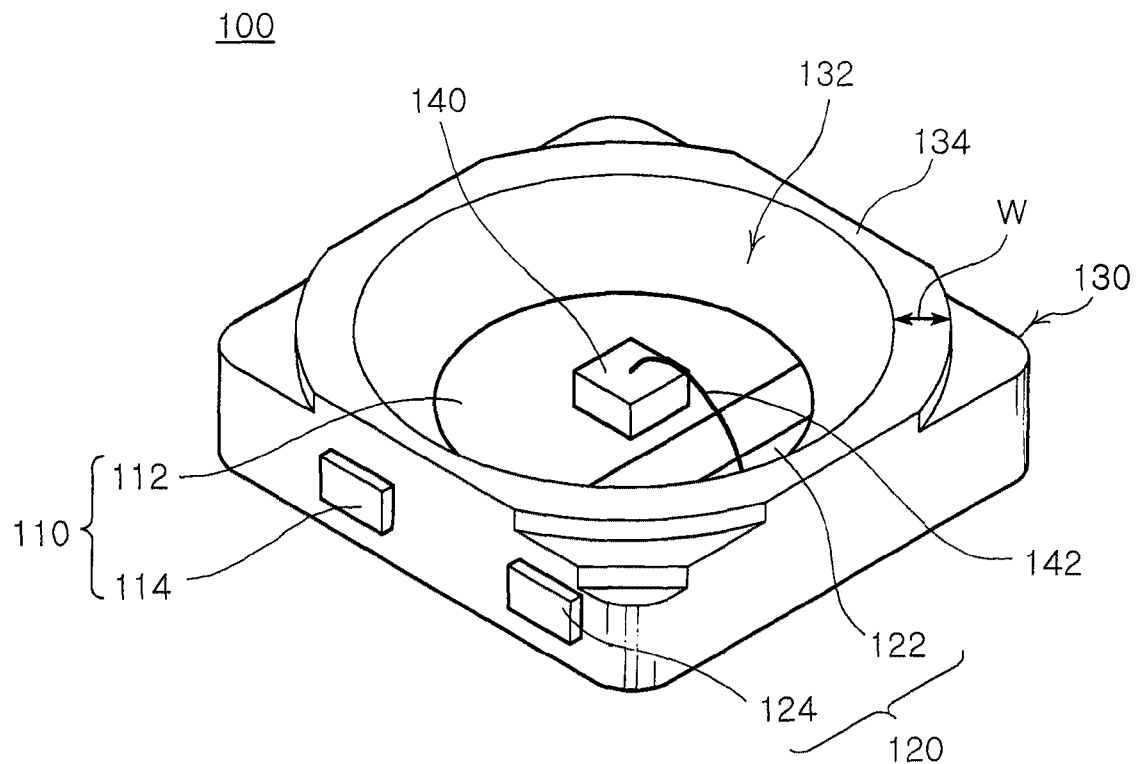
FIG. 4 is a sectional view illustrating an LED package according to a first embodiment of the present invention.
Figure 5:
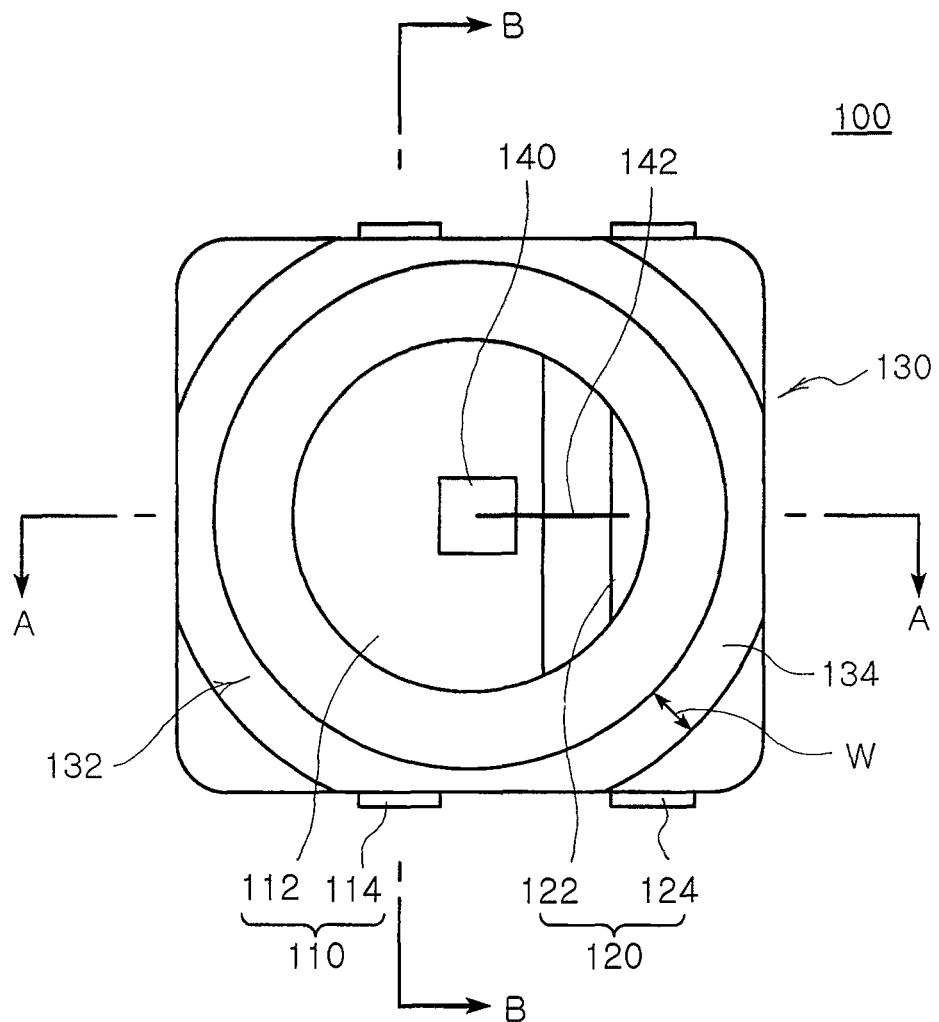
FIG. 5 is a plan view of the LED package of FIG. 4.

In the LED package 100-4, the extension 114-4 can be extended out of the package body 130 to form a terminal 8 as in the prior art shown in FIG. 2. In this case, the first lead frame base 112 can only serve the function of transferring heat or can also serve the function of electric connection together with the extension 114-4, which is the terminal. In the meantime, both of the extensions 114-4 can extend out of the package body 140 to form terminals.

The LED package 100-4 with this configuration can also be fabricated easily by the method shown in FIGS. 15 to 19.

In addition, although not illustrated, the extensions 124 of the LED package 100 shown in FIGS. 4 to 8 can also extend out of the package body 130 to form terminals.

The present invention as stated hereinabove allows an LED package with a simple configuration which can achieve superior heat radiation efficiency. Furthermore, the present invention provides a method for easily fabricating an LED package which can achieve superior heat radiation efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode package comprising:
   first and second lead frames spaced apart from each other and formed of a heat and electric conductor;
   a package body fixing the first and second lead frames while exposing an underside surface of at least one of the first and second lead frames;
   a light emitting diode chip disposed on an upper surface of the first lead frame or the second lead frame; and
   a transparent encapsulant for encapsulating the light emitting diode chip,
   wherein each of the first and second lead frames comprises a planar base and a pair of extensions,
   wherein the extensions of the first lead frame extend in opposite directions and an upward direction from opposed ends of the planar base of the first lead frame, and the extensions of the second lead frame extend in opposite directions and an upward direction from opposed ends of the planar base of the second lead frame, and
   wherein the planar base and extensions of the first lead frame extend, in a lengthwise direction of the first lead frame, substantially in parallel with those of the second lead frame.

2. The light emitting diode package according to claim 1, wherein the package body has a recess formed around the light emitting diode chip and a protrusion is formed in a predetermined width on an upper end of the recess.

3. The light emitting diode package according to claim 2, wherein a portion of the transparent encapsulant fills the recess and another portion of the transparent encapsulant protrudes over the protrusion in a predetermined curvature.

4. The light emitting diode package according to claim 1, wherein the underside surfaces of the bases of the first and second lead frames are coplanar with an underside surface of the package body.

5. The light emitting diode package according to claim 1, wherein ends of the extensions are positioned at side portions of the package body.

6. The light emitting diode package according to claim 1, wherein at least one of the extensions of the first lead frame extends out of the package body to form a terminal.

7. The light emitting diode package according to claim 1, wherein the second lead frame has a smaller width than the first lead frame.

8. The light emitting diode package according to claim 1, wherein the distal ends of each of the pair of extensions extend to the outside of the package body.

9. The light emitting diode package according to claim 1, wherein the at least one of the first and second lead frames is partially removed from the exposed underside surface thereof or another surface thereof parallel to the exposed underside surface.

10. The light emitting diode package according to claim 1, wherein distal ends of each pair of extensions of the first and second lead frames extend from side portions of the package body.

* * * * *